Jan. 17, 1967 A. McDOWELL ET AL 3,299,289
PULSE-LENGTHENING CIRCUIT EMPLOYING VOLTAGE CONTROLLED THRESHOLD TRANSISTOR FOR ISOLATING OUTPUT FROM INPUT DURING PULSE PRODUCING PERIOD
Filed Jan. 6, 1964
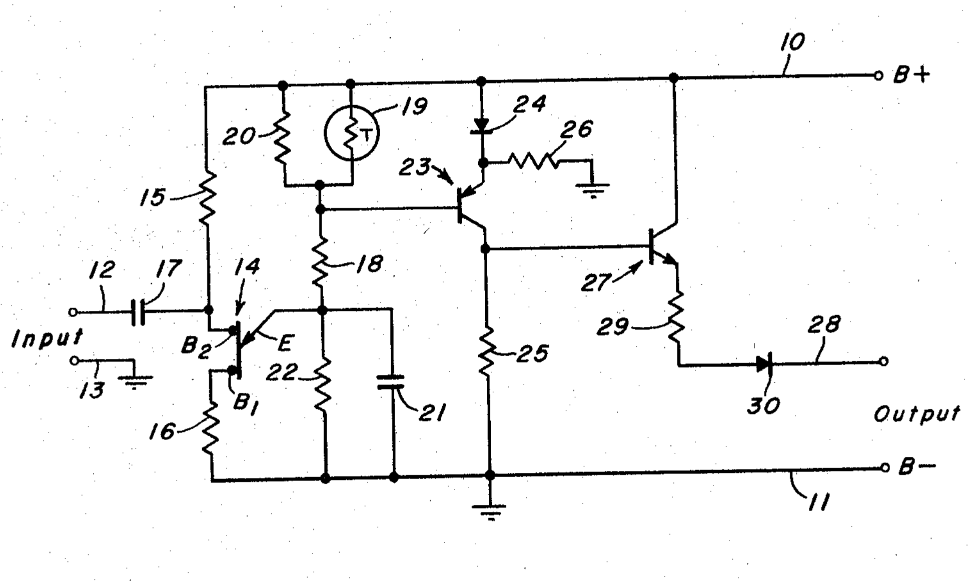
INVENTORS.
ALAN Mc DOWELL and
ROBERT W. MOWERY
By Donald G. Dalton
Attorney United States Patent Office 3,299,289

Patented Jan. 17, 1967

3,299,289

PULSE-LENGTHENING CIRCUIT EMPLOYING VOLTAGE CONTROLLED THRESHOLD TRANSISTOR FOR ISOLATING OUTPUT FROM INPUT DURING PULSE PRODUCING PERIOD

Alan McDowell and Robert W. Mowery, Columbus, Ohio, assignors, by mesne assignments, to United States Steel Corporation, a corporation of Delaware Filed Jan. 6, 1964, Ser. No. 335,989
6 Claims. (Cl. 307—88.5)

This invention relates to an improved pulse-lengthening circuit.

An object of the invention is to provide a simplified transistor circuit for converting weak, irregularly shaped input pulses into lengthened output pulses suitable for operating another mechanism, such as a relay or solenoid.

A further object is to provide a circuit which produces output pulses of a constant but adjustable magnitude and duration almost instantaneously on receiving input pulses.

In the drawing:

The single figure is a schematic wiring diagram of our pulse-lengthening circuit.

The figure shows conductors 10 and 11 which we connect to the positive and negative sides B+ and B— of a D.C. voltage source (for example 10 volts) and input conductors 12 and 13 which we connect to a source of weak irregular pulses. We illustrate the negative conductors 11 and 13 as grounded, although this is optional. We connect the bases $B_2$ and $B_1$ of a unijunction transistor 14 to the positive and negative conductors 10 and 11 via resistors 15 and 16 respectively. Resistor 15 is of intermediate size (for example 1.2K ohms) and resistor 16 much smaller (for example 33 ohms). We also connect base $B_2$ of the transistor to the pulse input conductor 12 via a capacitor 17. We connect the emitter E of the unijunction transistor to the positive conductor 10 via a relatively large resistor 18 and a parallel intermediate size thermistor 19 and resistor 20 (for example 47K, 3.15K and 3K ohms respectively). We also connect this emitter to the negative conductor 11 via a parallel capacitor 21 and relatively large resistor 22 (for example 47K ohms).

We connect the emitter of a PNP transistor 23 to the positive conductor 10 via a silicon diode 24, and we connect the collector thereof to the negative conductor 11 via a relatively larger resistor 25 (for example 10K ohms). We also connect diode 24 to ground via a bias resistor 26 (for example 1.5K ohms) in parallel with transistor 23 and resistor 25. We connect the base of transistor 23 between resistors 18 and 20. We connect the collector of an NPN transistor 27 to the positive conductor 10, and we connect the emitter thereof to a pulse output conductor 28 via a relatively small resistor 29 (for example 470 ohms) and a diode 30. We connect the base of transistor 27 to the collector of transistor 23.

A unijunction transistor offers relatively high resistance to flow of current between its emitter and its base $B_1$ as long as the voltage on its emitter does not exceed the threshold voltage, sometimes referred to as the "firing voltage." When the transistor is operated with a positive voltage applied to its base $B_2$ with respect to its base $B_1$, the "threshold voltage" is defined as the maximum positive voltage which can be applied to the emitter with respect to base $B_1$ before the resistance between the emitter and base $B_1$ suddenly becomes quite low. The threshold voltage can be reached either by driving the voltage on the emitter more positive or driving the voltage on base $B_2$ less positive. For a more detailed explanation of the operation of a unijunction transistor, reference can be made to a printed publication, General Electric Transistor Manual, 6th edition, copyright 1962 (chapter 13). A PNP transistor allows current to flow from its emitter to its collector when a voltage which is negative with respect to its emitter is applied to its base; otherwise it is practically nonconductive.

As long as our circuit is in its state of rest, the voltage on the emitter of the unijunction transistor 14 is less than the threshold voltage, since we choose values of resistors 15, 18, 20 and 22 and thermistor 19 to render this condition. Current flow between the emitter and base $B_1$ is negligible. When the circuit was first turned on, current passed from the positive conductor 10 through the parallel thermistor 19 and resistor 20 and resistor 18 to the parallel combination of capacitor 21 and resistor 22. Part of this current flowed to capacitor 21 and the remainder flowed through resistor 22 to the negative conductor 11. When capacitor 21 became fully charged, that portion of the current ceased to flow, but a small current continues to flow through resistor 22. Current also flows from the positive conductor 10 through the diode 24 and bias resistor 26 to ground to furnish a positive bias voltage to the emitter of transistor 23. The voltage on the base of this transistor equals the B+ voltage diminished by the voltage drop across the parallel thermistor 19 and resistor 20. Under these conditions the voltage on the base is more positive than that on the emitter and the transistor is effectively nonconducting. The base of transistor 27 is at ground potential, and this transistor likewise is effectively nonconducting. Consequently there is no current flow in the output conductor 28.

When the pulse input conductor 12 receives a negative pulse, this pulse is applied to the base $B_2$ of the unijunction transistor 14 via the capacitor 17 and momentarily drives the voltage on this base in a less positive direction. If the pulse has sufficient magnitude, the voltage on base $B_2$ becomes less positive to a point that the voltage on the emitter exceeds the threshold voltage. Suddently the resistance between the emitter and base $B_1$ breaks down, whereupon capacitor 21 discharges through the unijunction transistor and the relatively small resistor 16. Since the pulse is of momentary duration, the unijunction transistor quickly returns to its original condition in which current flow effectively ceases, thereby isolating the output from further input pulses. Capacitor 21 recharges, and the resulting current flow increases the voltage drop through the parallel thermistor 19 and resistor 20. The positive voltage on the base of the PNP transistor 23 drops to a value below the bias voltage on the emitter, whereupon transistor 23 becomes conducting. A positive voltage signal reaches the base of the NPN transistor 27, whereupon transistor 27 likewise becomes conducting. An output pulse appears across conductors 28 and 11. As soon as capacitor 21 becomes fully charged, the circuit returns to its state of rest already described, and the output pulse ceases.

The magnitude of the output pulses is determined by the B+ voltage and the value of resistor 29, and the duration by the length of time capacitor 21 takes to charge. The charging time is determined by the values of resistors 18, 20 and 22, thermistor 19 and capacitor 21. The purpose of the thermistor is to provide temperature compensation so that the time constant is stable over a wide range of temperature conditions. Diode 24 and bias resistor 26 insure that transistor 23 remains nonconducting until it receives a signal to conduct. Diode 30 assures that transistor 27 remains nonconducting even under high temperatures when connected to a D.C. load, and also blocks a negative pulse from going out to an A.C. load when the transistor is turned off.

With the circuit described we have successfully produced output pulses of a duration of 1 to 100 milliseconds from input pulses of a few microseconds. The delay between the receipt of the input pulse and the start of the output pulse is negligible, being approximately 1 to 3 microseconds. It is understood that the values we have stated for the various resistors and voltages are only for purposes of example and can vary widely.

While we have shown and described only a single embodiment of the invention, it is apparent that modifications may arise. Therefore, we do not wish to be limited to the disclosure set forth but only by the scope of the appended claims.

We claim:

1. A circuit for producing lengthened output pulses, said circuit comprising positive and negative conductors connected to opposite sides of a D.-C. voltage source, a voltage-controlled threshold transistor connected across said conductors, means normally biasing said transistor to be nonconducting, a capacitor connected across said conductors to be charged thereby and to remain charged while said transistor is nonconducting, means connected with said transistor for applying weak irregular input pulses of short duration relative to said output pulses, thereby overcoming the threshold bias and rendering said transistor momentarily conductive to discharge said capacitor, said transistor at turn-off acting to isolate the output from further input pulses during recharging of said capacitor, the charging time of said capacitor determining the duration of output pulses, and means connected across said conductors and controlled by said capacitor's charging for transmitting output pulses of lengthened duration and greater magnitude than the input pulses.

2. A circuit as defined in claim 1 in which said transistor is of the unijunction type having two bases and an emitter, said emitter and one of said bases being connected with said positive and negative conductors respectively, the other base being connected with the means for applying input pulses to control flow of current between said emitter and said first-named base, said capacitor being connected with said emitter.

3. A circuit as defined in claim 1 in which said last-named means includes a second transistor connected across said conductors, means normally biasing said second transistor to be nonconductive, means connecting said second transistor with said first transistor to render said second transistor conductive when said capacitor charges, and a third transistor connected with one of said conductors and to said second transistor to be rendered conductive when said second transistor conducts.

4. A circuit as defined in claim 3 in which said second transistor is of the PNP type and has an emitter connected with said positive conductor and with said second-named biasing means, a collector connected with said negative conductor, and a base connected with said first transistor to be driven less positive than said emitter when said first transistor conducts.

5. A circuit as defined in claim 3 in which said second-named biasing means includes a silicon diode connected between said positive conductor and said second transistor and a resistor connected between said diode and said negative conductor.

6. A circuit as defined in claim 3 in which said third transistor is of the NPN type and has a collector connected with said positive conductor, a base connected with said second transistor, and an emitter, said circuit including an output conductor connected with said emitter.

References Cited by the Examiner

UNITED STATES PATENTS

| | | | |
|---|---|---|---|
| 2,837,663 | 6/1958 | Walz | 307—88.5 |
| 3,060,331 | 10/1962 | Habisohn | 307—88.5 |
| 3,149,293 | 9/1964 | Farkas | 307—88.5 |

ARTHUR GAUSS, *Primary Examiner.*

J. HEYMAN, *Assistant Examiner.*